(12) United States Patent
Fan et al.

(10) Patent No.: US 9,986,659 B2
(45) Date of Patent: May 29, 2018

(54) ROTATING SHAFT, FAN, AND ELECTRONIC DEVICE

(71) Applicant: Lenovo (Beijing) Limited, Beijing (CN)

(72) Inventors: Jui-Chan Fan, Beijing (CN); Jeng-Ming Lai, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 0 days. days.

(21) Appl. No.: 15/463,834

(22) Filed: Mar. 20, 2017

(65) Prior Publication Data

US 2017/0268518 A1   Sep. 21, 2017

(30) Foreign Application Priority Data

Mar. 21, 2016   (CN) .......................... 2016 1 0162688

(51) Int. Cl.
| | |
|---|---|
| *H05K 7/20* | (2006.01) |
| *F04D 19/00* | (2006.01) |
| *F04D 29/056* | (2006.01) |
| *F04D 29/053* | (2006.01) |
| F04D 29/063 | (2006.01) |

(52) U.S. Cl.
CPC ....... *H05K 7/20172* (2013.01); *F04D 19/002* (2013.01); *F04D 29/053* (2013.01); *F04D 29/056* (2013.01); *H05K 7/20136* (2013.01); F04D 29/063 (2013.01); H05K 7/20 (2013.01); H05K 7/20009 (2013.01); H05K 7/20127 (2013.01); H05K 7/20154 (2013.01); H05K 7/20218 (2013.01); H05K 7/20718 (2013.01); H05K 7/20981 (2013.01)

(58) Field of Classification Search
None
See application file for complete search history.

(56) References Cited

U.S. PATENT DOCUMENTS

| | | | |
|---|---|---|---|
| 6,699,020 B1 * | 3/2004 | Lin | ........................ F04D 29/057 384/286 |
| 2009/0225511 A1 * | 9/2009 | Hsu | ........................ H01L 23/467 361/697 |

FOREIGN PATENT DOCUMENTS

| | | |
|---|---|---|
| CN | 2445120 Y | 8/2001 |
| CN | 2634156 Y | 8/2004 |
| CN | 2916206 Y | 6/2007 |
| JP | H07279975 A | 10/1995 |

* cited by examiner

*Primary Examiner* — Dimary Lopez Cruz
*Assistant Examiner* — Zhengfu Feng
(74) *Attorney, Agent, or Firm* — Ference & Associates LLC

(57) ABSTRACT

One embodiment provides rotating shaft, including: a spindle comprising an internal first channel; a wheel casing operatively coupled to the spindle, wherein the wheel casing comprises an internal second channel; and a bearing housing the spindle, comprising a third channel located between the bearing and the spindle; wherein the first channel, the second channel, and the third channel are located to form an enclosed annular channel configured to hold a substance. Other aspects are described and claimed.

20 Claims, 14 Drawing Sheets

ROTATING SHAFT, FAN, AND ELECTRONIC DEVICE

CLAIM FOR PRIORITY

This application claims priority to Chinese Application No. 201610162688.2 filed on Mar. 21, 2016, which is fully incorporated by reference herein.

FIELD

The subject matter described herein relates to the technical field of mechanical design technologies, more specifically, it relates to a rotating shaft, a fan and an electronic device.

BACKGROUND

In order to more effectively cool servers, such as host servers, the revolving speed of cooling fans currently adopted is very high (e.g. over 20,000 rpm in some instances). As a result, the spindle of the fan produces a large amount of heat and cannot be cooled down in time, thus causing the fan to be prone to malfunction.

BRIEF SUMMARY

In summary, one aspect provides a rotating shaft, comprising: a spindle comprising an internal first channel; a wheel casing operatively coupled to the spindle, wherein the wheel casing comprises an internal second channel; and a bearing housing the spindle, comprising a third channel located between the bearing and the spindle; wherein the first channel, the second channel, and the third channel are located to form an enclosed annular channel configured to hold a substance.

Another aspect provides a fan, comprising: a plurality of fan blades; and a rotating shaft, wherein the rotating shaft comprises: a spindle comprising an internal first channel; a wheel casing operatively coupled to the spindle, wherein the wheel casing comprises an internal second channel; and a bearing housing the spindle, comprising a third channel located between the bearing and the spindle; wherein the first channel, the second channel, and the third channel are located to form an enclosed annular channel configured to hold a substance.

A further aspect provides an electronic device, comprising: a device body; a fan operatively coupled to the device body, wherein the fan comprises a plurality of fan blades and a rotating shaft; the rotating shaft comprising: a spindle comprising an internal first channel; a wheel casing operatively coupled to the spindle, wherein the wheel casing comprises an internal second channel; and a bearing housing the spindle, comprising a third channel located between the bearing and the spindle; wherein the first channel, the second channel, and the third channel are located to form an enclosed annular channel configured to hold a substance.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Figure 1:
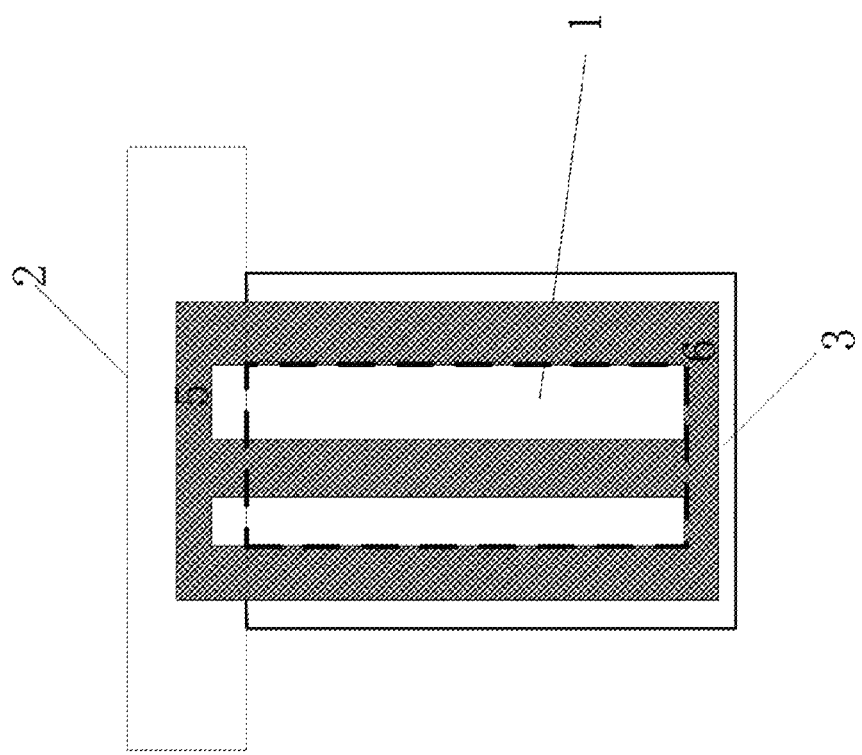
FIG. 1 is a structural schematic diagram showing an exemplary rotating shaft.
Figure 2:
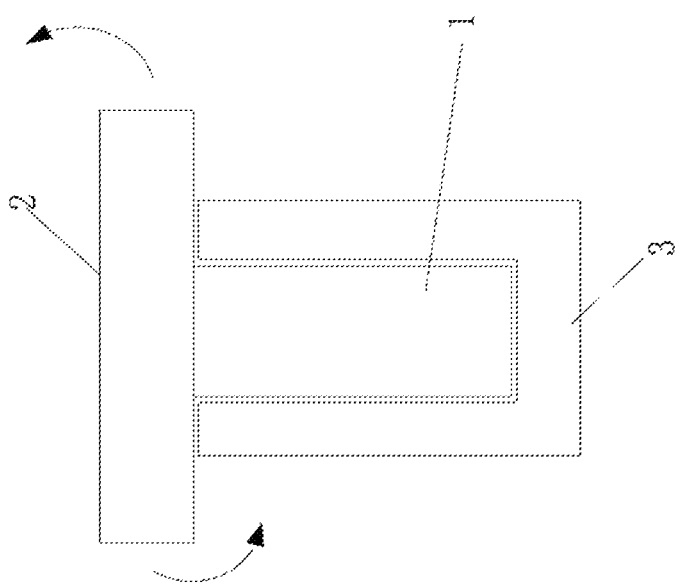
FIG. 2 is a structural schematic diagram showing an exemplary rotating shaft.

Referring now to FIG. 1, the structure of a rotating shaft according to an embodiment is illustrated. In an embodiment, the rotating shaft can be the rotating shaft in various rotational structures, for instance, the rotating shaft in a fan. In an embodiment, the rotating shaft may include the following structures: a spindle 1, a wheel casing 2 and a bearing 3. The wheel casing 2 is connected to the spindle 1 and the spindle 1 is sleeved in the bearing 3 so that the spindle 1 can drive the wheel casing to rotate in the bearing 3, as shown in FIG. 2.

Figure 3:
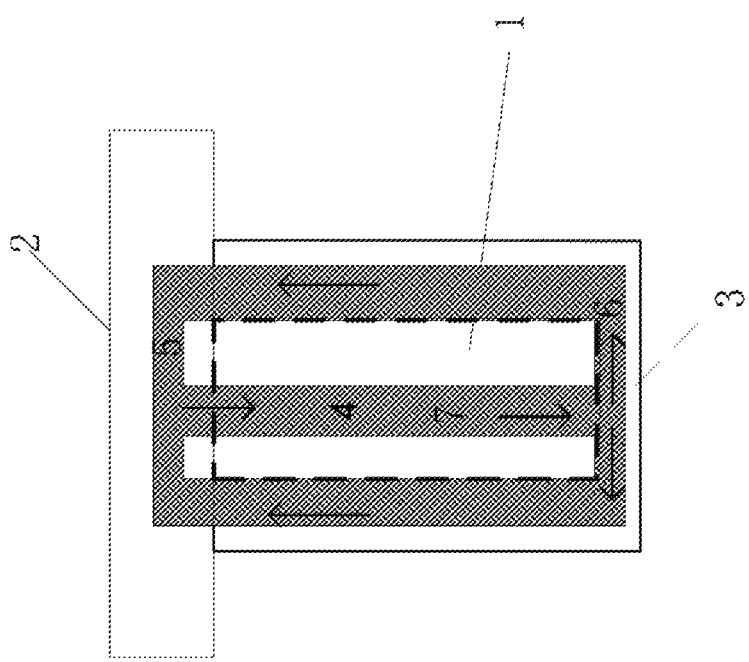
FIG. 3 is a structural schematic diagram showing an exemplary rotating shaft.

Referring now to FIG. 3, in an embodiment, the spindle 1 is internally provided with a first channel 4, the wheel casing 2 is internally provided with a second channel 5, and a third channel 6 is formed between the bearing 3 and the spindle 1. In an embodiment, the first channel 4, the second channel 5 and the third channel 6 are connected to form an enclosed annular channel in which a first substance 7 can circularly flow in the annular channel to take away the heat emitted from the spindle 1 to the wheel casing, thereby cooling the spindle 1.

In an embodiment, by arranging the first channel in the spindle of the rotating shaft, the second channel in wheel casing, and the third channel between the bearing and the spindle, the three channels can form an enclosed annular channel by connection. The first substance in this annular channel can flow inside or outside of the spindle to take away the heat of the spindle to the wheel casing, thus realizing timely cooling for the spindle and avoiding fan malfunction. In this way, the objective of the embodiment is achieved.

In an embodiment, in order to better cool the spindle 1, a substance with higher heat dissipation performance, for instance, oil and the like, can be used as the first substance 7 in the annular channel. More specifically, a lubricating oil can be added into the annular channel to accelerate the flow and cooling, thus improving the cooling effect of the spindle 1.

Figure 4B:
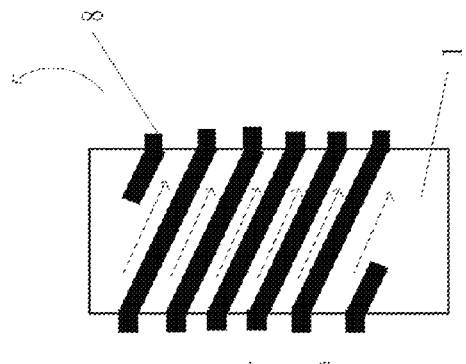
FIG. 4B is a structural schematic diagram showing a partial view of the exemplary structure of FIG. 4A.
Figure 4C:
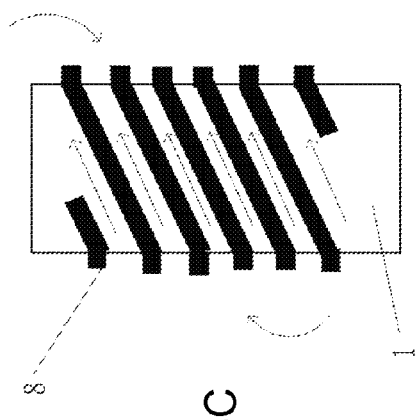
FIG. 4C is a structural schematic diagram showing a partial view of the exemplary structure of FIG. 4A.
Figure 4A:
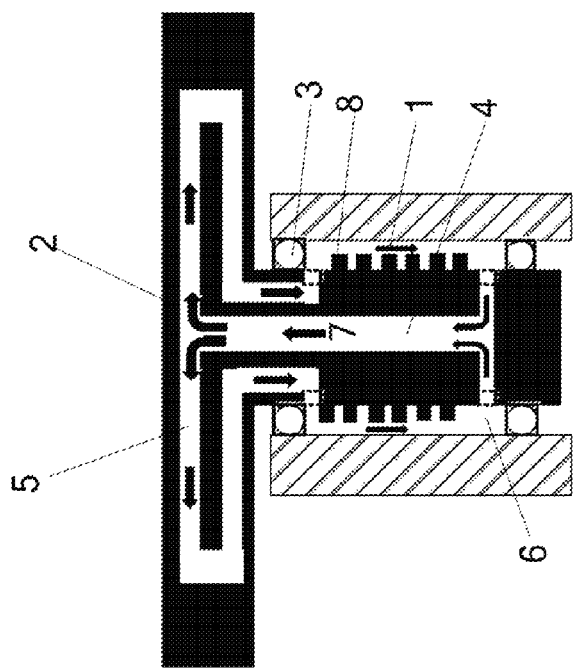
FIG. 4A is a structural schematic diagram showing an exemplary structure.

Referring now to FIGS. 4(A-C), in an embodiment, in order to accelerate the flow velocity of the first substance 7 in the annular channel, a thread 8 with the first direction can be arranged on the outer side of the spindle 1, as shown in FIG. 4A. The first direction is associated with the rotation direction of the spindle 1 so that the flow velocity of the first substance 7 in the annular channel can be greater than a preset first threshold value. The first threshold value may be understood as the flow velocity of the first substance 1 in the annular channel when there is no thread arranged on the outer side of the spindle 1. Correspondingly, the meaning of the flow velocity being greater than the first threshold value is that the flow velocity of the first substance 7 when the thread 8 is arranged on the outer side of the spindle 1 is greater than that of the first substance 7 when no thread 8 is arranged on the outer side of the spindle 1.

In an embodiment, when the rotation direction of the spindle 1 is the clockwise direction from the top view, as shown in FIG. 4B, the first direction can also be the direction which is high at left and low at right. Therefore, when the spindle 1 rotates clockwise at a high speed, the first substance in the thread 8 can be driven to accelerate the downward flow. In an embodiment, when the rotation direction of the spindle 1 is the counter-clockwise direction from the top view, as shown in FIG. 4C, the first direction can also be the direction which is low at left and high at right. Therefore, when the spindle 1 rotates counter-clockwise at a high speed, the first substance in the thread 8 can be driven to accelerate the upward flow.

Figure 5:
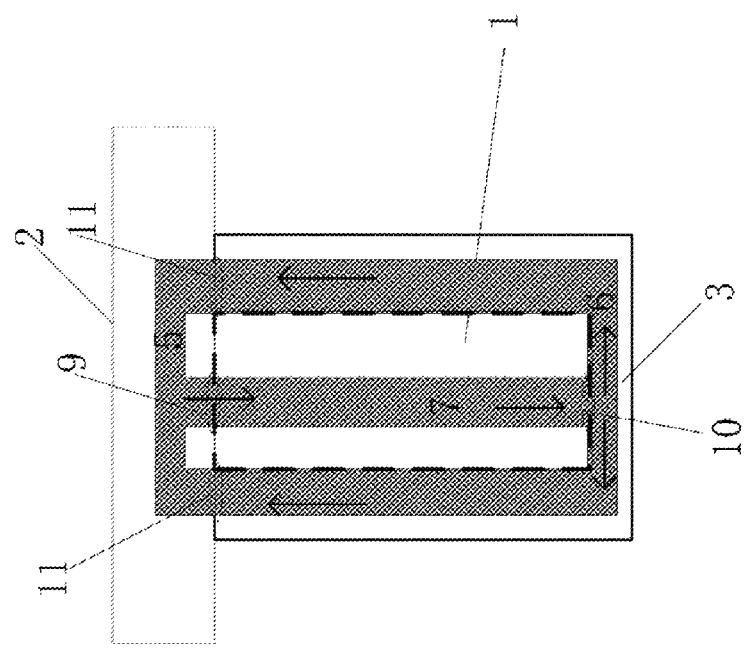
FIG. 5 is a structural schematic diagram showing an exemplary structure.

Referring now to FIG. 5, the structure of the rotating shaft according to an embodiment is illustrated. In an embodiment, the first channel 4 is connected with the second channel 5 through the first spindle hole 9 at the top of the spindle 1. The first channel 4 is connected with the third channel 6 through the second spindle hole 10 at the bottom of the spindle 1. The second channel 5 is connected with the third channel 6 through the third spindle hole 11 on the outer side of the spindle 1. Thus, the first channel 4, the second channel 5 and the third channel 6 can form an enclosed annular channel through the above three spindle holes, so that the first substance 7 can flow circularly in the annular channel, so as to cool the spindle 1.

Figure 6B:
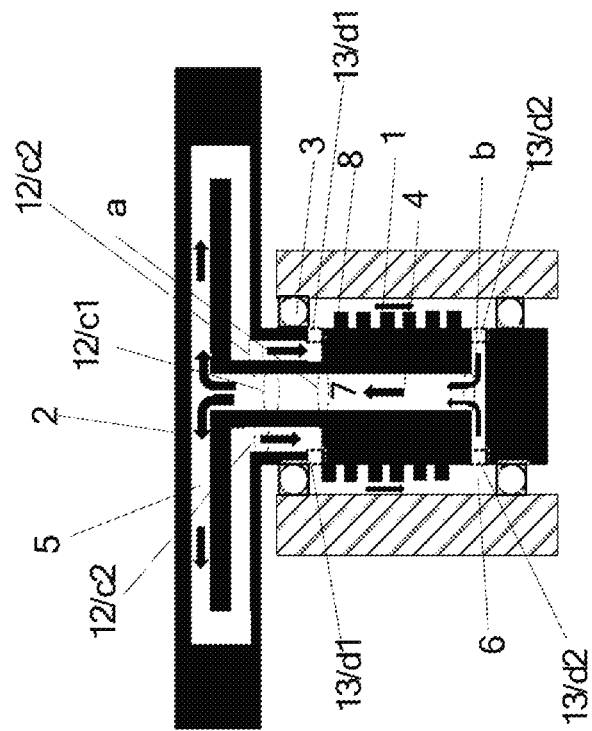
FIG. 6B is a structural schematic diagram showing an exemplary structure.
Figure 6A:
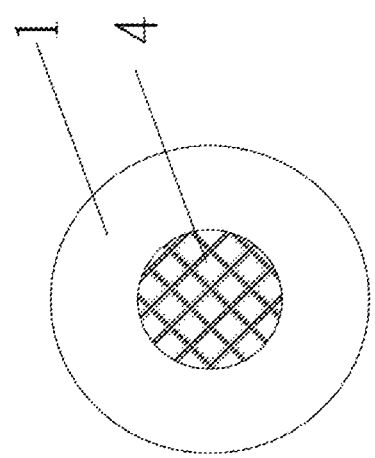
FIG. 6A is a structural schematic diagram showing a partial view of an exemplary structure.

Referring now to FIGS. 6(A-B), in an embodiment, as shown in FIG. 6A, the first channel 4 is a cylindrical channel. In an embodiment, as shown in FIG. 6B, the second channel 5 is an umbrella-shaped channel with an opening 12. The third channel 6 is an annular channel with two openings 13. Accordingly, the second channel 5 is connected with the opening (a) one end of the first channel 4 through the opening 12 (c1) at the center of the umbrella-shaped channel. The second channel 5 is connected with an opening 13 (d1) of the third channel 6 through the opening 12(c2) at both ends of the second channel 5. The other opening 13 (d2) of the third channel 6 is connected with the opening (b) at the other end of the first channel 4. Thus, an annular channel, similar to a T-shaped structure, is formed between the first channel 4, the second channel 5 and the third channel 6, so that the first substance 7 can flow circularly in the annular channel, so as to cool the spindle 1.

Figure 7:
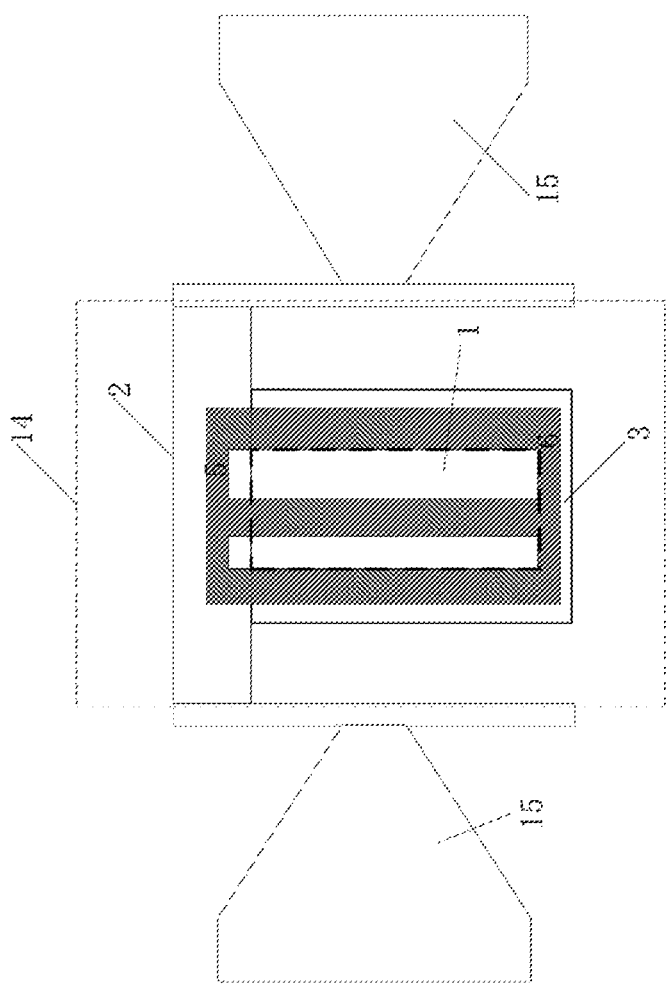
FIG. 7 is a structural schematic diagram showing the structure of an exemplary fan.
Figure 8:
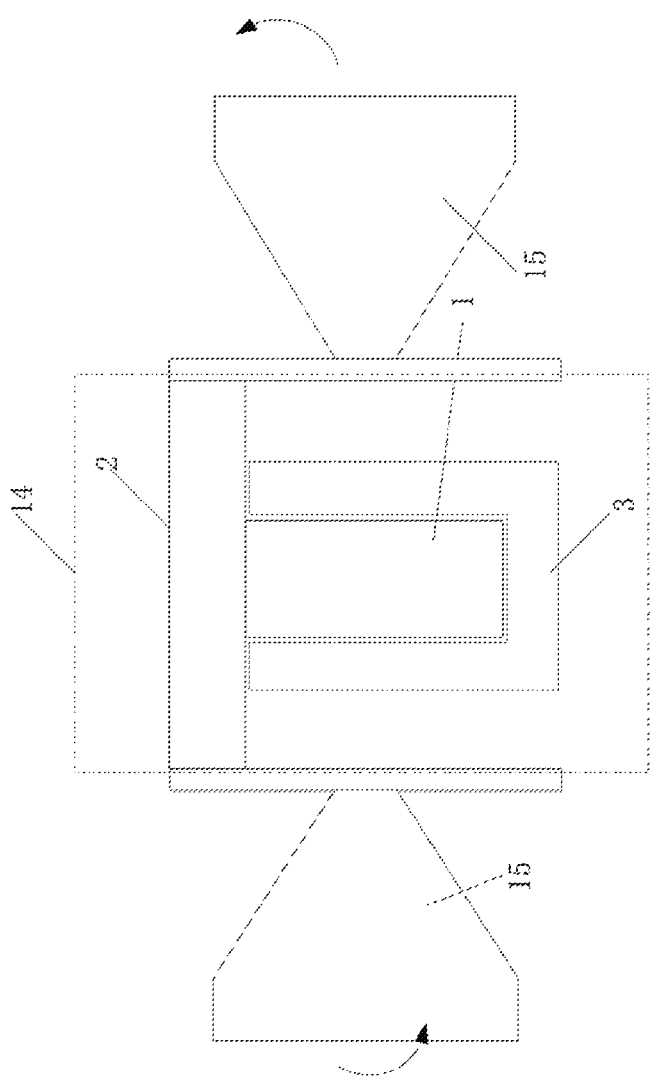
FIG. 8 is a structural schematic diagram showing the structure of an exemplary fan.

Referring now to FIG. 7, the structure of a fan according to an embodiment is illustrated. In an embodiment, the fan refers to a fan for a device such as a laptop, desktop and the like, or other kinds of fans. In an embodiment, the fan may comprise the following structures: a rotating shaft 14 and fan blades 15. The rotating shaft 14 may be composed of the following structures: a spindle 1, a wheel casing 2 and a bearing 3. The wheel casing 2 is connected to the spindle 1, the spindle is sleeved in the bearing 3 so that the spindle 1 can drive the wheel casing to rotate in the bearing 3. As shown in FIG. 8, the fan blades 15 are arranged on both sides of the wheel casing 2, and the spindle 1 rotates in the bearing 3, so as to drive the wheel casing 2 and causing the fan blades 15 on the wheel casing 2 to rotate, thereby forming an air flow to cool the surroundings.

Figure 9:
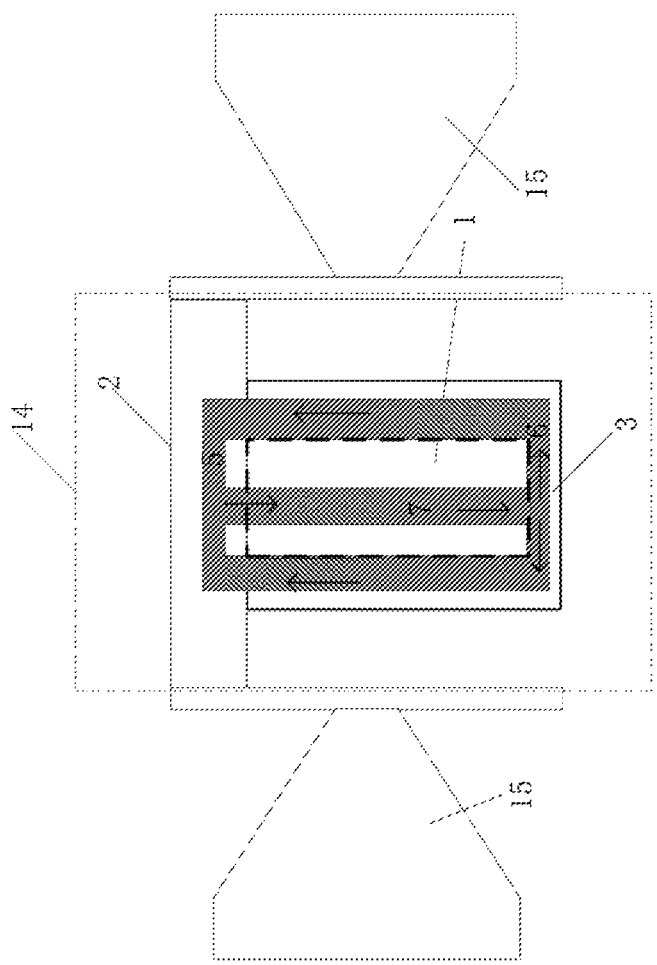
FIG. 9 is a structural schematic diagram showing the structure of an exemplary fan.

Furthermore, in an embodiment, the spindle 1 is internally provided with a first channel 4, the wheel casing 2 is internally provided with a second channel 5, and a third channel 6 is formed between the bearing 3 and the spindle 1. Referring now to FIG. 9, in an embodiment, the first channel 4, the second channel 5 and the third channel 6 are connected to form an enclosed annular channel, wherein the first substance 7 can flow in the annular channel to take away the heat emitted from the spindle 1 to the wheel casing, thereby cooling the spindle 1.

In an embodiment, by arranging the first channel in the spindle of the rotating shaft, the second channel in the wheel casing, and the third channel between the bearing and the spindle, the three channels can form an enclosed annular channel by connection. The first substance in the annular channel can flow inside or outside of the spindle to take away the heat of the spindle to the wheel casing, thereby cooling the spindle in time while the fan cools the surroundings, and avoiding fan malfunctions. In this way, the objective of the embodiment is achieved.

In an embodiment, in order to better cool the spindle 1, the first substance 7 in the annular channel can be the substance with a higher cooling performance, for instance, oil and the like. More specifically, lubricating oil can be added into the annular channel to accelerate the flow and cooling, thereby improving the cooling effect of the spindle 1.

Figure 10:
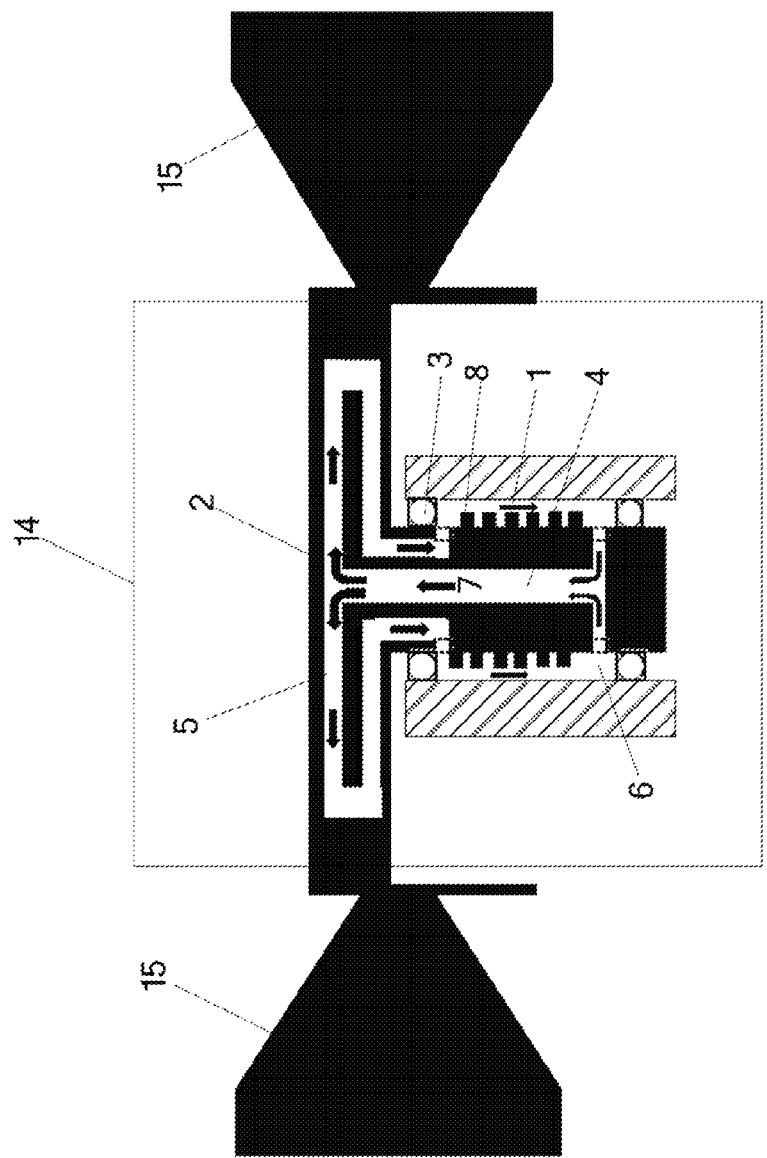
FIG. 10 is a structural schematic diagram showing the structure of an exemplary fan.

In an embodiment, in order to accelerate the flow velocity of the first substance 7 in the annular channel, the thread 8 with the first direction can be arranged on the outer side of the spindle 1, as shown in FIG. 10. The first direction is associated with the rotation direction of the spindle 1 so that the flow velocity of the first substance 7 in the annular channel can be greater than a preset first threshold value. The preset first threshold value can be understood as the flow velocity of the first substance 1 in the annular channel when there is no thread arranged on the outer side of the spindle 1. Accordingly, the meaning of the flow velocity being greater than the first threshold value is that the flow velocity of the first substance 7 when the thread 8 is arranged on the outer side of the spindle 1 is greater than that of the first substance 7 when there is no thread 8 arranged on the outer side of the spindle 1.

In an embodiment, when the rotation direction of the spindle 1 is the clockwise direction from the top view, as shown in FIG. 4B, the first direction can also be the direction which is high at left and low at right. Therefore, when the spindle 1 rotates clockwise at a high speed, the first substance in the thread 8 can be driven to accelerate the downward flow. When the rotation direction of the spindle 1 is the counter-clockwise direction from the top view, as shown in FIG. 4C, the first direction can also be the direction which is low at left and high at right. Therefore, when the spindle 1 rotates counter-clockwise at a high speed, the first substance in the thread 8 can be driven to accelerate the upward flow.

Figure 11:
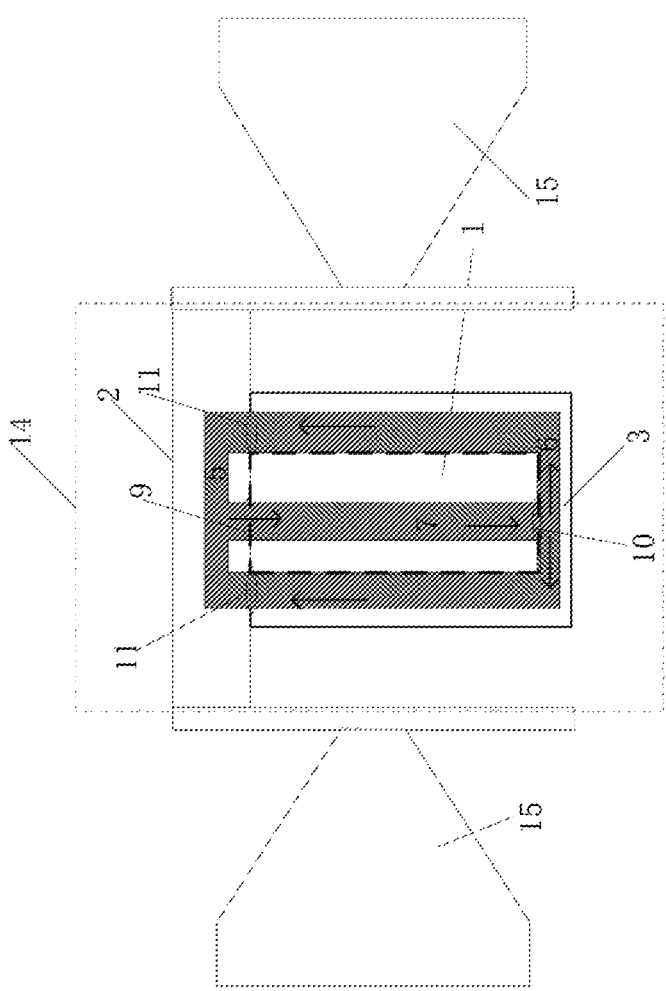
FIG. 11 is a structural schematic diagram showing the structure of an exemplary fan.

Referring now to FIG. 11, the structure of the rotating shaft according to an embodiment is illustrated. In an embodiment, the first channel 4 is connected with the second channel 5 through the first spindle hole 9 at the top of the spindle 1. The first channel 4 is connected with the third channel 6 through the second spindle hole 10 at the bottom of the spindle 1. The second channel 5 is connected with the third channel 6 through the third spindle hole 11 on the outer side of the spindle 1, as shown in FIG. 5. The first channel 4, the second channel 5 and the third channel 6 form an enclosed annular channel through the above three spindle holes so that the first substance 7 can flow circularly in the annular channel, so as to cool the spindle 1.

Figure 12:
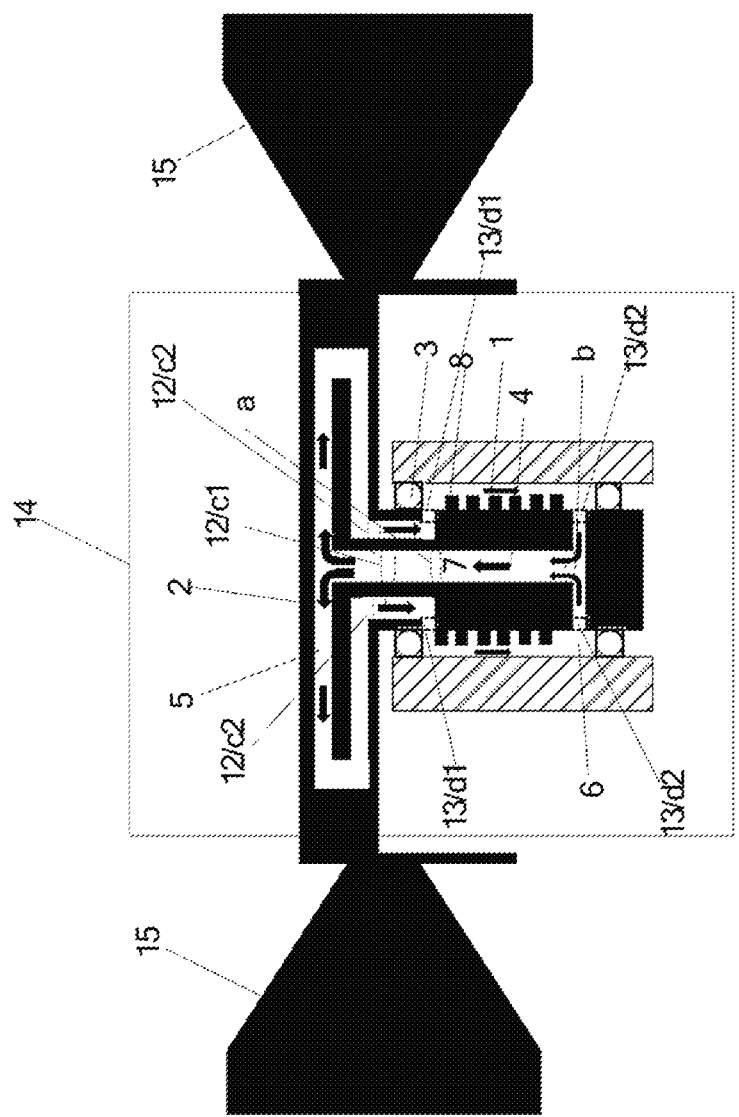
FIG. 12 is a structural schematic diagram showing the structure of an exemplary fan.

In an embodiment, the first channel 4 is a cylindrical channel, as shown in FIG. 6A, and the second channel 5 is an umbrella-shaped channel with an opening 12, as shown in FIG. 12. The third channel 6 is an annular channel with two openings 13. The second channel is connected to the opening (a) at one end of the first channel 4 through the opening 12 (c1) in the center of the umbrella-shaped channel. The second channel 5 is connected to an opening 13 (d1) of the third channel 6 through openings 12 (c2) at both ends, while the opening 13 (d2) of the third channel 6 is connected to the opening (b) at the other end of the first channel 4. Thus, an annular channel, similar to a T-shaped structure, is formed between the first channel 4, the second channel 5 and the third channel 6, so that the first substance 7 can flow circularly in the annular channel, so as to cool the spindle 1.

Figure 13:
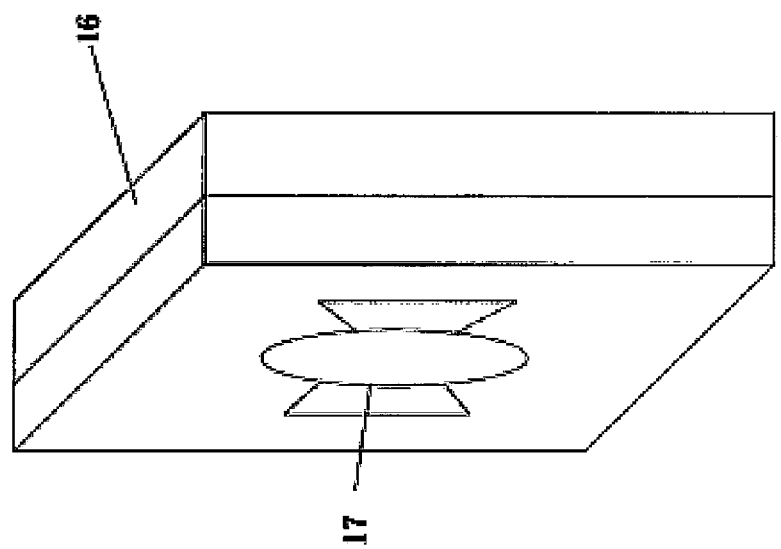
FIG. 13 is a structural schematic diagram showing the structure of an exemplary electronic device.
Figure 14:
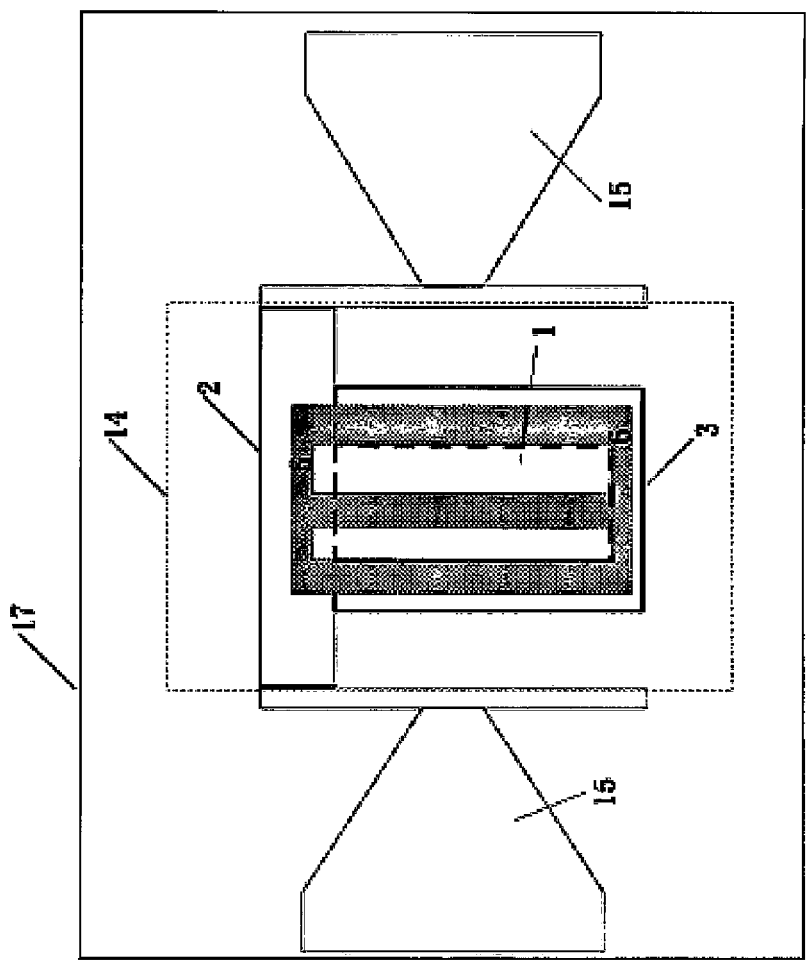
FIG. 14 is a structural schematic diagram showing a partial view of an exemplary structure.

Referring to FIG. 13, the structure of an electronic device according to an embodiment is illustrated. The electronic device can comprise: a device body 16 and a fan 17. In an embodiment, the fan 17 is connected to or close to the device body 16, so that the fan 17 can cool the device body 16. For example, as shown in FIG. 14, the fan 17 may comprise: a rotating shaft 14 and fan blades 15. The rotating shaft 14 may be composed of the following structures: a spindle 1, a wheel casing 2 and a bearing 3. The wheel casing 2 is connected to the spindle 1, the spindle 1 is sleeved in the bearing 3 so that the spindle 1 can drive the wheel casing to rotate in the bearing 3, as shown in FIG. 8. The fan blades 15 are arranged one both sides of the wheel casing 2, and the spindle 1 rotates in the bearing 3, so as to drive the wheel casing 2 and causing the fan blades 15 on the wheel casing 2 to rotate, thereby forming an air flow to cool the device body 16.

In an embodiment, the spindle 1 is internally provided with a first channel 4, the wheel casing 2 is internally provided with a second channel 5, and a third channel 6 is formed between the bearing 3 and the spindle 1. In an embodiment, the first channel 4, the second channel 5 and the third channel 6 are connected to form an enclosed annular channel, as shown in FIG. 9, wherein the first substance 7 can flow circularly in the annular channel to take away the heat emitted from the spindle 1 to the wheel casing, thereby cooling the spindle 1.

According to the above technical solution, by arranging the first channel in the spindle of the rotating shaft of the fan, the second channel in the wheel casing, and the third channel between the bearing and the spindle, the three channels can be connected to form an enclosed annular channel. The first substance in this annular channel can flow circularly inside or outside of the spindle to take away the heat of the spindle, thereby cooling the device body and the spindle of the fan in time, and avoiding fan malfunction. In this way, the objective of the embodiment is achieved.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:
1. A rotating shaft, comprising:
   a spindle comprising an internal first channel;
   a wheel casing operatively coupled to the spindle, wherein the wheel casing comprises an internal second channel; and
   a bearing housing the spindle, comprising a third channel located between the bearing and the spindle;
   wherein the first channel, the second channel, and the third channel are located to form an enclosed annular channel configured to hold a substance.
2. The rotating shaft of claim 1, wherein the substance comprises oil.
3. The rotating shaft of claim 1, wherein the spindle comprises an external thread.

4. The rotating shaft of claim 3, wherein the external thread is in a first direction associated with a rotational direction of the spindle.

5. The rotating shaft of claim 1, further comprising a first spindle hole located at the top of the spindle, a second spindle hole located at the bottom of the spindle, and a third spindle hole located external to the spindle.

6. The rotating shaft of claim 5, wherein the first channel is connected to the second channel via the first spindle hole;
wherein the first channel is connected to the third channel via the second spindle hole; and
wherein the second channel is connected to the third channel via the third spindle hole.

7. The rotating shaft of claim 1, wherein the first channel is a cylindrical-shaped channel, the second channel is an umbrella-shaped channel comprising a centrally positioned opening, and the third channel is an annular channel comprising two openings.

8. The rotating shaft of claim 7, wherein the second channel is connected to the first channel via the centrally positioned opening in the second channel;
wherein the second channel is connected to the third channel via the two openings of the third channel; and
the third channel is connected to an opening at the end of the first channel.

9. A fan, comprising:
a plurality of fan blades; and
a rotating shaft, wherein the rotating shaft comprises:
a spindle comprising an internal first channel;
a wheel casing operatively coupled to the spindle, wherein the wheel casing comprises an internal second channel; and
a bearing housing the spindle, comprising a third channel located between the bearing and the spindle;
wherein the first channel, the second channel, and the third channel are located to form an enclosed annular channel configured to hold a substance.

10. The fan of claim 9, wherein the plurality of fan blades are arranged around an external portion of the wheel casing.

11. The fan of claim 10, wherein the plurality of fan blades are configured to spin around a center line of the spindle.

12. The fan of claim 9, wherein the substance comprises oil.

13. The fan of claim 9, wherein the spindle comprises an external thread.

14. The fan of claim 13, wherein the external thread is in a first direction associated with a rotational direction of the spindle.

15. The fan of claim 9, further comprising a first spindle hole located at the top of the spindle, a second spindle hole located at the bottom of the spindle, and a third spindle hole located external to the spindle.

16. The fan of claim 9, wherein the first channel is connected to the second channel via the first spindle hole;
wherein the first channel is connected to the third channel via the second spindle hole; and
wherein the second channel is connected to the third channel via the third spindle hole.

17. The fan of claim 9, wherein the first channel is a cylindrical-shaped channel, the second channel is an umbrella-shaped channel comprising a centrally positioned opening, and the third channel is an annular channel comprising two openings.

18. The fan of claim 17, wherein the second channel is connected to the first channel via the centrally positioned opening in the second channel;
wherein the second channel is connected to the third channel via the two openings of the third channel; and
the third channel is connected to an opening at the end of the first channel.

19. An electronic device, comprising:
a device body;
a fan operatively coupled to the device body, wherein the fan comprises a plurality of fan blades and a rotating shaft;
the rotating shaft comprising:
a spindle comprising an internal first channel;
a wheel casing operatively coupled to the spindle, wherein the wheel casing comprises an internal second channel; and
a bearing housing the spindle, comprising a third channel located between the bearing and the spindle;
wherein the first channel, the second channel, and the third channel are located to form an enclosed annular channel configured to hold a substance.

20. The electronic device of claim 19, wherein the fan is configured to cool the electronic device.

* * * * *